United States Patent
Manahan et al.

(10) Patent No.: US 10,237,710 B2
(45) Date of Patent: Mar. 19, 2019

(54) CONTROL SYSTEM WITH SMART DEVICES FOR HAZARDOUS ENVIRONMENTS

(71) Applicant: Cooper Technologies Company, Houston, TX (US)

(72) Inventors: Joseph Michael Manahan, Manlius, NY (US); Adikaramge Asiri Jayawardena, Manlius, NY (US); Stephan Iannce, Clay, NY (US); Benjamin Avery Freer, Syracuse, NY (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 257 days.

(21) Appl. No.: 14/867,764

(22) Filed: Sep. 28, 2015

(65) Prior Publication Data
US 2017/0094444 A1    Mar. 30, 2017

(51) Int. Cl.
*H04W 4/00* (2018.01)
*G08C 17/04* (2006.01)
(Continued)

(52) U.S. Cl.
CPC .............. *H04W 4/80* (2018.02); *G08C 17/02* (2013.01); *G08C 17/04* (2013.01);
(Continued)

(58) Field of Classification Search
CPC ....... H04W 4/008; H04W 4/02; H04W 84/12; H04W 76/023; G01S 19/19;
(Continued)

(56) References Cited

U.S. PATENT DOCUMENTS

| | | | |
|---|---|---|---|
| 3,999,074 A | 12/1976 | Callaghan | |
| 4,249,794 A | 2/1981 | Haley | |
| 4,898,445 A | 2/1990 | Newell et al. | |
| 5,090,791 A | 2/1992 | Kidder et al. | |
| 6,313,587 B1 * | 11/2001 | MacLennan | H01J 61/025 315/224 |
| 7,002,084 B2 | 2/2006 | Cox et al. | |
| 7,397,003 B2 | 7/2008 | Cox et al. | |

(Continued)

FOREIGN PATENT DOCUMENTS

| | | |
|---|---|---|
| JP | 2002-140952 A | 5/2002 |
| WO | 2010/095945 A1 | 8/2010 |

OTHER PUBLICATIONS

International Search Report and Written Opinion from Corresponding Application No. PCT/US2016/051433; dated Dec. 20, 2016.

*Primary Examiner* — Dionne H Pendleton
(74) *Attorney, Agent, or Firm* — Pearne & Gordon LLP

(57) ABSTRACT

A control system for hazardous environments decreases flame paths, decreases punctures to the control system when installing interfaces, and increases safety. The control system may be characterized as a "one size fits all" controller that is able to automatically recognize a plurality of user interfaces. The controller has an enclosure to which the interfaces can be attached. The interfaces may interact with control electronics wholly contained in the enclosure using a variety of "wireless" mechanisms. Such mechanisms include reflecting light waves, infrared (IR) communication, radio-frequency identification, inductive coils, short-range wireless communication, camera images, piezoelectricity, and magnetism, and the like. The interfaces may include switches, indicator lights, smoke detectors, and the like.

10 Claims, 4 Drawing Sheets

(51) Int. Cl.
  *H04W 4/80* (2018.01)
  *G08C 17/02* (2006.01)
  *G05G 9/047* (2006.01)
  *H03K 17/97* (2006.01)

(52) U.S. Cl.
  CPC ............ *G05G 2009/04744* (2013.01); *G05G 2009/04755* (2013.01); *G05G 2009/04762* (2013.01); *G08C 2201/30* (2013.01); *H03K 2017/9706* (2013.01)

(58) Field of Classification Search
  CPC ............ G06F 19/3406; G06F 19/3456; G06F 19/3462; G06Q 50/01; G08B 5/36; G08B 6/00; H04L 67/12; Y02B 60/50; G08C 17/04; G08C 2201/30
  See application file for complete search history.

(56) References Cited

U.S. PATENT DOCUMENTS

| | | | |
|---|---|---|---|
| 8,785,793 | B2 | 7/2014 | Cox et al. |
| 2007/0205231 | A1* | 9/2007 | Haul ................ D06F 33/02 222/544 |
| 2010/0181172 | A1 | 7/2010 | Monig et al. |
| 2012/0160052 | A1 | 6/2012 | Manahan et al. |
| 2014/0132522 | A1* | 5/2014 | Bowen ............... G06F 3/0234 345/168 |
| 2016/0227352 | A1* | 8/2016 | Khalilzadeh ........ H04W 76/023 |
| 2017/0093981 | A1* | 3/2017 | Cameron ............. H04L 67/12 |
| 2018/0011509 | A1* | 1/2018 | Maier .................. G05G 5/05 |
| 2018/0270548 | A1* | 9/2018 | Richter ................ H04Q 9/00 |

* cited by examiner

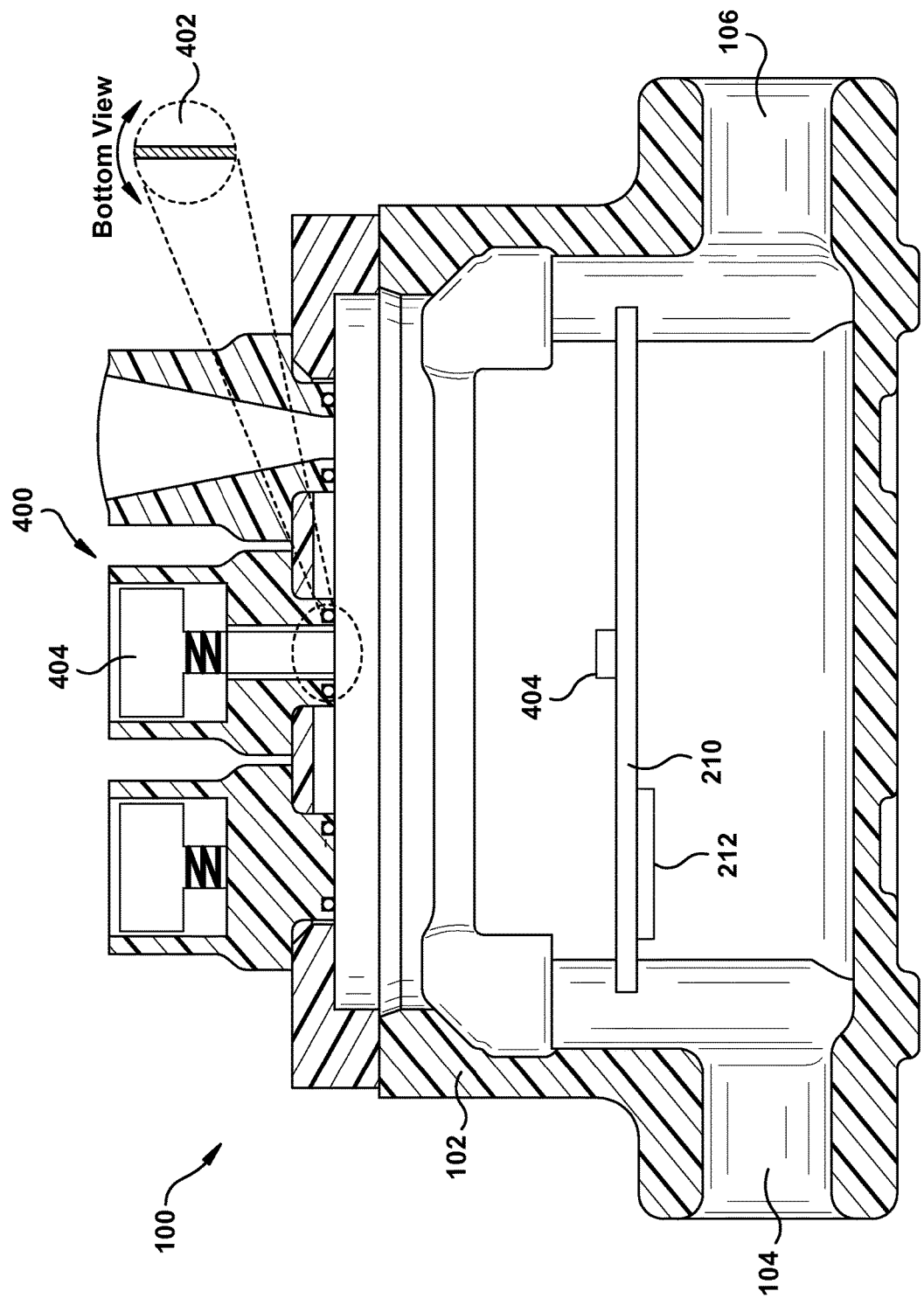

CONTROL SYSTEM WITH SMART DEVICES FOR HAZARDOUS ENVIRONMENTS

BACKGROUND

This application relates generally to a control system, and more specifically to a control system for various environments including hazardous environments.

Present control systems are comprised of hundreds of components. Such a large number of components complicates the manufacturing process and leads to increases in costs and time of manufacturing. Such complexity also affects distributor's stock of components. Additionally, devices used in current controllers have a significant number of flame paths. These flame paths decrease safety and can affect reliability of the devices and controller.

BRIEF SUMMARY

According to one example described herein, a control system comprises: an enclosure comprising an opening on a front face and electronics for controlling a device; and at least one interface mounted to the front face of the enclosure, which at least partially covers the opening and which is physically isolated from the electronics, wherein the at least one interface is configured to communicate with the electronics.

In various embodiments of the above example, the enclosure has at least one of an inlet and an outlet through which electronics or wiring of the device controlled by the control system pass; the enclosure has a light source and a light detector, and the interface is optically connected to the electronics via the light source and the light detector; the at least one interface comprises optical element for altering a path of light emitted by the light source and a moveable aperture, the moveable aperture being movable to shield or expose the optical element in response to a mechanical actuation of the interface; when the optical element is exposed to light emitted by the light source, the light is reflected toward the light detector; and when the optical element is shielded from light emitted by the light source, the light is not reflected toward the light detector, wherein detection of reflected light by the light detector is indicative of a state of the interface; the electronics control at least one operation of a device based on the state of the interface that corresponds to the device; the interface comprises pivotable or rotatable mirror, the mirror being pivotable or rotatable in response to an actuation of the interface; in a first position of the pivotable or rotatable mirror, light emitted by the light source is reflected toward the light detector; and in a second position of the pivotable or rotatable mirror, light emitted by the light source is not reflected toward the light detector, wherein detection of reflected light by the light detector is indicative of the state of the interface; the electronics control a device based on the state of the interface; the interface has a light mixing chamber and a clear cover for viewing light from the light source, the light source being operated in response to a status of a device controlled by the controller; the enclosure has a first inductive coil and/or a first short-range wireless device, the first short-range wireless device being a receiver, transmitter, and/or transceiver, the interface has a second inductive coil and/or a second short-range wireless device, the second short-range wireless device being a receiver, transmitter, and/or transceiver, and the interface is wirelessly connected to the electronics via the first inductive coil and/or the first short-range wireless device; the first inductive coil and second inductive coil are short-range wireless devices for transferring power and data; the interface has a light source, light detector, and a moveable shield, the moveable shield being moveable into and out of a space between light source and the light detector in response to a mechanical actuation of the interface by a user to interrupt or allow transmission of light from the light source to the light detector; communication between the first inductive coil and/or first short-range wireless device, and the second inductive coil and/or second short-range wireless device is based on whether light from the light source is detected by the light detector; the electronics control a device based on the communication; the interface has a mechanical or electrical switch that is actuated between a first state and a second state in response to a mechanical actuation of the interface by a user; communication between the first inductive coil and/or first short-range wireless device, and the second inductive coil and/or second short-range wireless device is based on the state of the switch; the electronics control a device based on the communication; the interface has a light source, a light mixing chamber, and a clear cover for viewing light from the light source, the light source being operated in response to communication between the first inductive coil and/or first short-range wireless device, and the second inductive coil and/or second short-range wireless device; the enclosure has a camera configured to generate images of a pattern on the interface, the pattern being rotated or otherwise altered in response to a mechanical actuation of the interface by a user; the electronics control a device based on an analysis of pattern in the images; each of the at least one interfaces has a unique identifier communicated to the electronics, such that the electronics can automatically recognize the interface; the interface is a smoke detector, such that the interface detects smoke when light emitted by the light source is not detected by the light detector; the enclosure is an explosion-proof enclosure for use in hazardous environments and physically isolates the at least one interface from the electronics which reduces a number of flame paths associated with the system; the interface comprises a piezo-electric element that generates a current upon actuation of the interface, and wherein the current is utilized for communication between the interface and the electronics; the interface comprises at least one magnetic element and at least one sensor, and wherein the sensor detects a magnetic flux caused by actuation of the magnetic element; the interface comprises a capacitive touch element that generates a current upon actuation of the interface, and wherein the current is utilized for communication between the interface and the electronics; the device may be controlled by a physical user input at the at least one interface or automatically by comparison of a signal value to a threshold.

BRIEF DESCRIPTION OF THE DRAWINGS

FIG. 4 is a cross-section of a controller illustrating another three example devices.

DETAILED DESCRIPTION

Figure 1A:
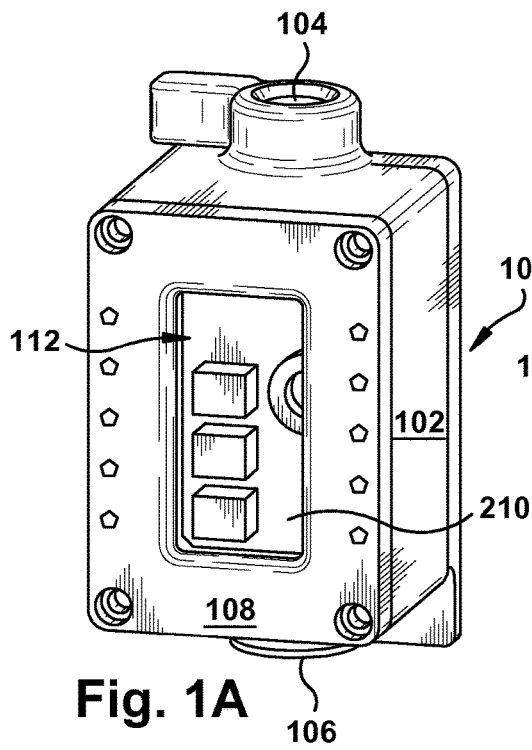
FIGS. 1A-1D is an illustration of perspective views of controllers having zero, one, two, and three devices.
Figure 1B:
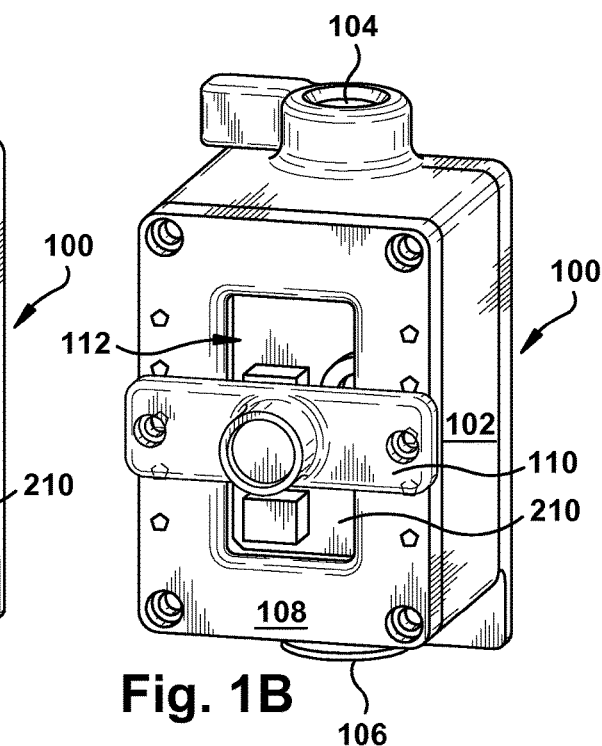
Figure 1C:
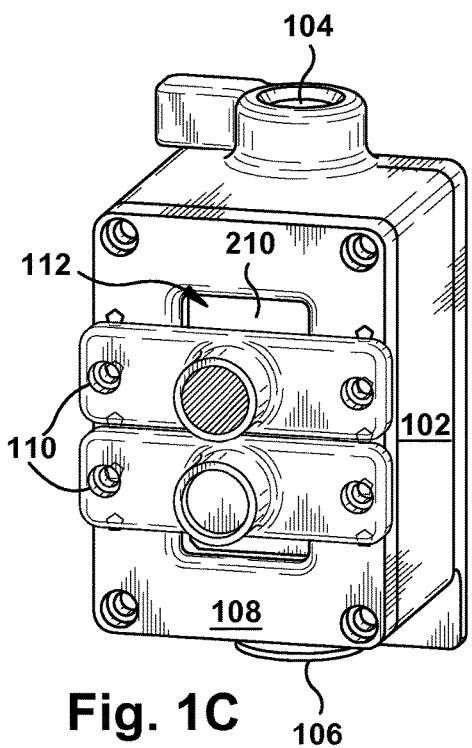
Figure 1D:
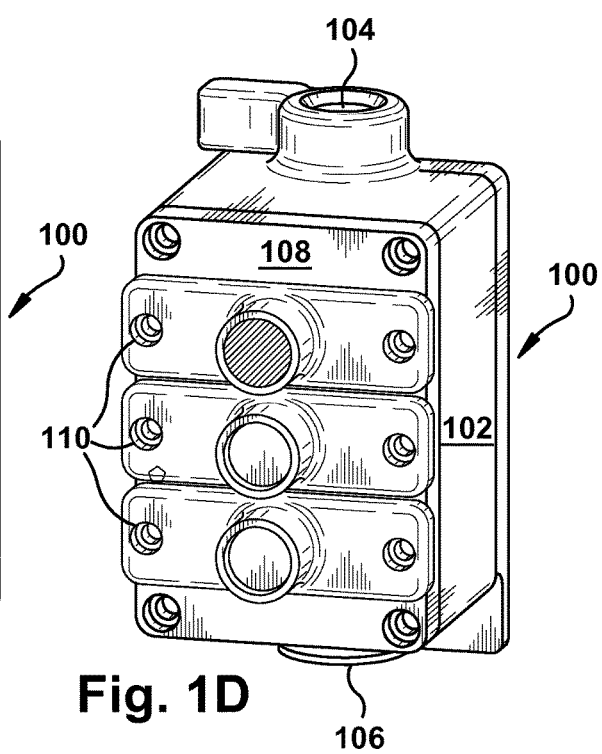

Certain terminology is used herein for convenience only and is not to be taken as a limitation on the claimed invention. Relative language used herein is best understood with reference to the drawings, in which like numerals are used to identify like or similar items. Further, in the drawings, certain features may be shown in somewhat schematic form.

Generally, the controller can be described as comprising two aspects. According to a first aspect, the controller can be fitted with a plurality of devices, which may be auto-recognized by the controller. According to a second aspect, the interfaces (e.g., switches, actuators, relays, lights, and the like) associated with each of the plurality of devices are used to control and operate the respective devices.

Turning now to FIG. 1, a controller 100 has a box-shaped enclosure 102 comprising an inlet 104, an outlet 106, and a front face 108. The enclosure 102 may be, for example, a NEMA7 explosion-proof metallic enclosure. The inlet and outlet provide connections for devices operated and controlled by the controller. A circuit board 210 comprising a processor(s) 212 and associated electrical components may be mounted within the enclosure 102. The components and processor 212 of the circuit board 210 control the devices of the controller 100. As illustrated in the figures, the inlet 104 and outlet 106 are provided on opposite sides of the controller enclosure 102. However, the shape and configuration illustrated in the figures is not intended to be limiting and it is noted that the controller 100 and enclosure 102 can take on any shape, size, or configuration. For example, in other embodiments (not illustrated), the enclosure may be a "back box" having a single outlet or inlet, or be a standalone box with no outlets or inlets.

With respect to the first aspect described herein, the front face 108 of the enclosure 102 may be fitted with a plurality of interfaces 110 associated with devices of the controller 100. The front face 108 provides an opening 112 to the interior of the enclosure 102 on which the plurality of interfaces 110 may be mounted across. The opening 112 may be recessed into the enclosure 102 and a circuit board 210 may be positioned within the recessed opening.

Each interface 110 may be mounted or installed by securing the interface 110 to the exterior of the front face 102 of the enclosure 102 using bolts, screws, adhesives, and the like. In this way, the interfaces 110 fully extend over and cover the opening 112 along one direction. Additional interfaces 110 may cover or overlap the opening 112 along the other direction. Any portion of the opening 112 not covered by interfaces 110 may be covered by patches or "blank" pieces and these blanks maybe similar in size and/or shape to any of the interfaces present thereon or may have a different appearance from the interfaces 110. The interfaces 110 may also be collectively installed as single unified piece that may completely cover the opening 112.

Each interface 110 may comprise substantially the same general size and/or shape relative to the opening 112 of the enclosure 102. In other words, each interface 110 may be installed or applied to the enclosure 102 using a common form factor. This eliminates a need for unique drilling of the controller 100 and enclosure 102 to suit individual interface 110 and device requirements. This further eliminates additional penetrations through the controller 100 and enclosure 102, thereby decreasing flame paths and improving safety.

Figure 2:
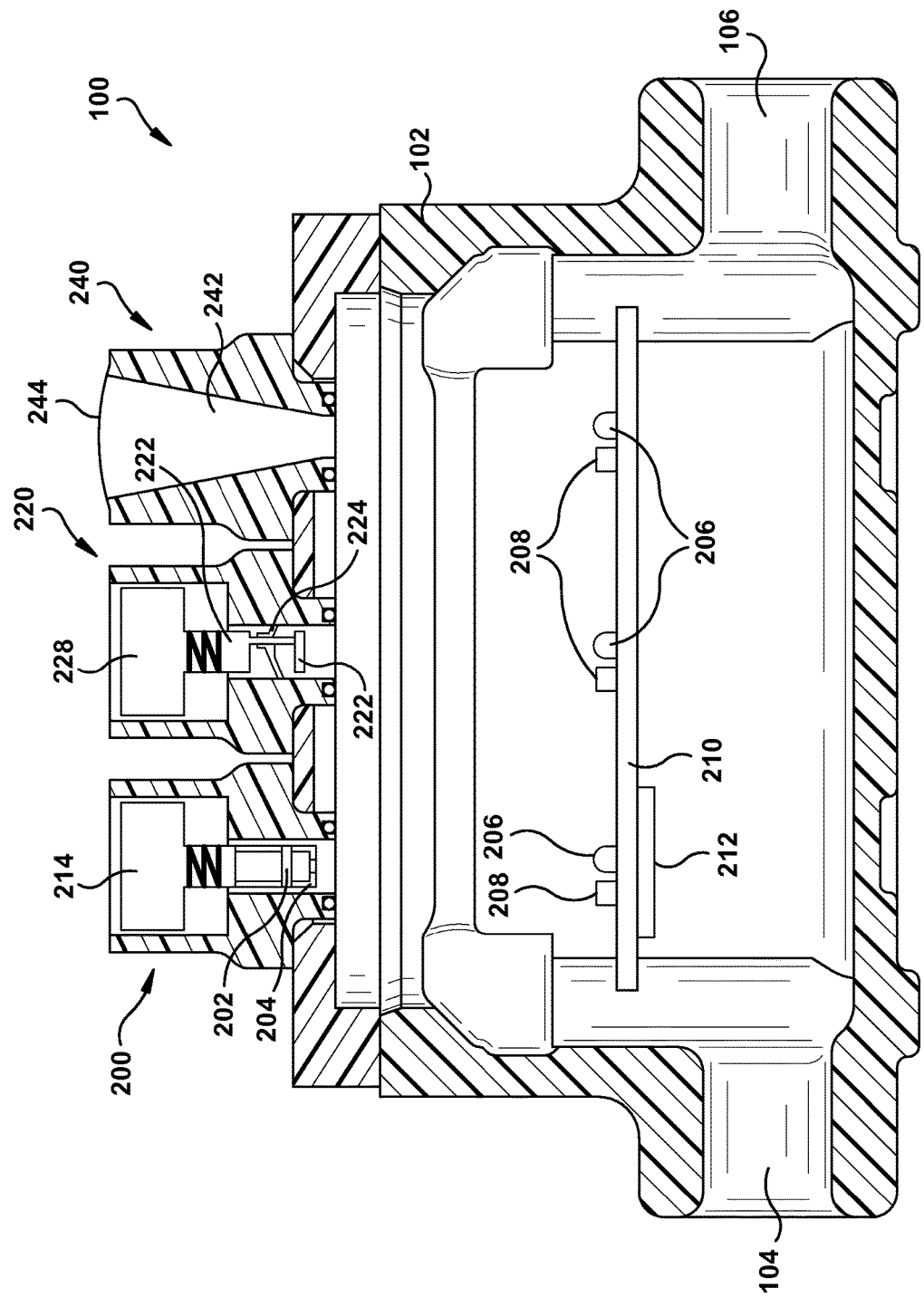
FIG. 2 is a cross-section of a controller illustrating three example devices.
Figure 3:
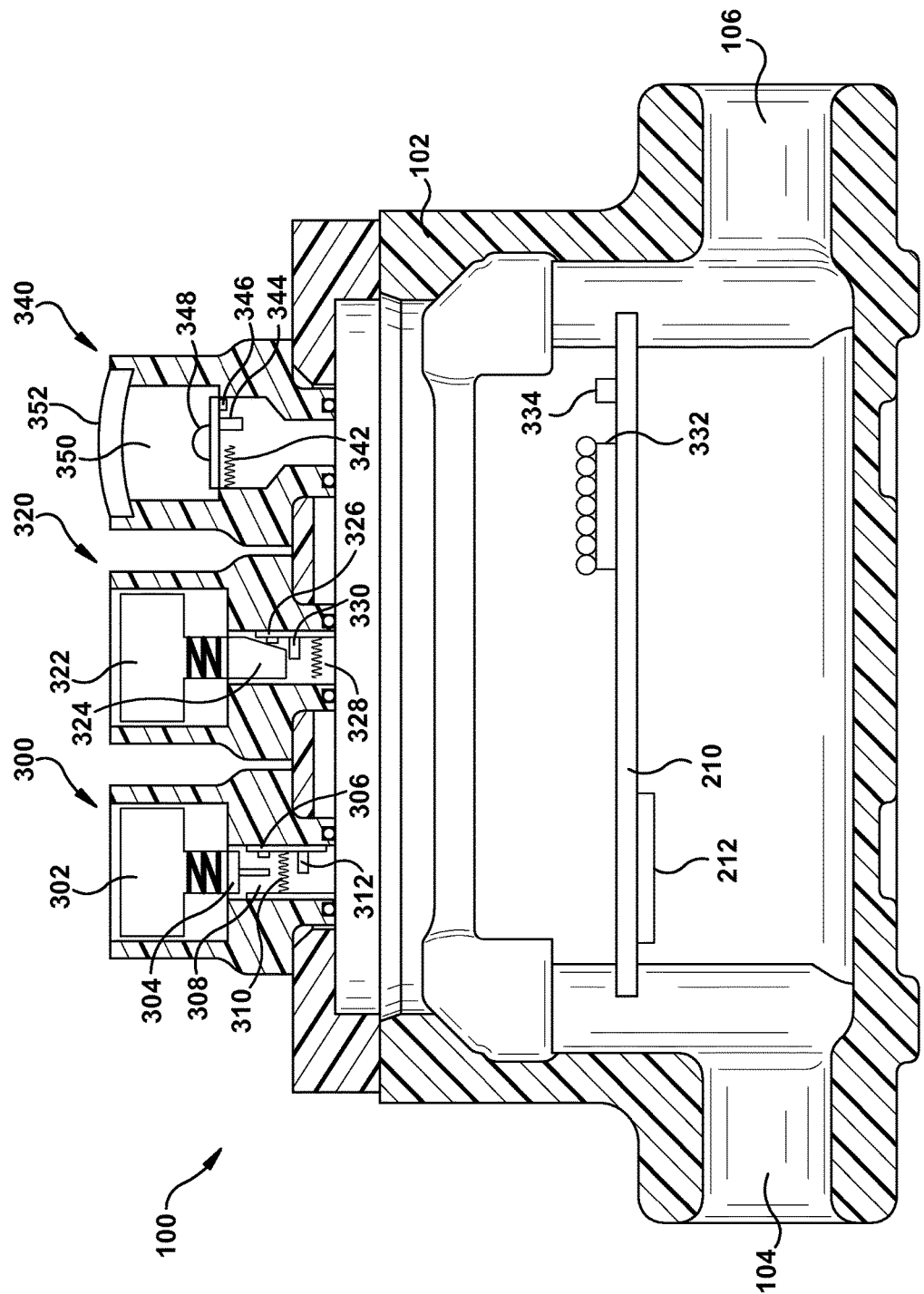
FIG. 3 is a cross-section of a controller illustrating another three example devices.

Specific examples of interfaces according to the second aspect are described herein with respect to FIGS. 2-4. According to a first example illustrated in FIG. 2, an interface 200 may comprise a stationary mirror 202 and a movable aperture 204. While a mirror is described herein, it is noted that various embodiments could use any optical element that can alter a path of light, such as a lens or prism. A mechanical button (e.g., a spring biased push button) may be depressed to operate the movable aperture, so as to expose or shield the mirror. A light source (e.g., light emitting diode (LED) with narrow optics, such as a collimator) 206 and light detector 208 electrically connected to the circuit board 210 and processor 212 may be located underneath the mirror 202. The light source 206 and light detector 208 may be tunable to particular wavelengths/bandwidths of light. In this way, a light wave emitted by the light source 206 is directed toward the mirror 202. The interface 200 may be operated (e.g., by a push button 214) to expose and shield the mirror 202 by moving the movable aperture 204. When the interface 200 is operated such that the mirror 202 is exposed, the light wave is reflected back toward the circuit board 210, where it is detected by the light detector 208. Similarly, when the mirror 202 is shielded, light is neither reflected back toward nor detected by the light detector 208. In some embodiments, operation or actuation of the interface 200 may operate to alter light emitted by the light source 206 such that only a particular wavelength/bandwidth of light reaches the light detector 208. Thus, each scenario as described (e.g., light detected, no light detected, particular wavelength/bandwidths of light detected) may be associated with a state of the interface 200. The depression of the button 214 of the interface 200 changes the state of the interface 200, thereby controlling or determining a current state of the interface 200. Depending on whether light is detected by the light detector 208, the processor(s) 212 may appropriately operate an associated device according to a desired function controlled by the interface 200. In other words, for example, a first state of the interface 200 may be intended to cause a device to turn-on and a second state of the interface 200 is intended to cause a device to turn-off. In this instance, when the light detector 208 indicates a first state of the interface 200, the processor 212 may cause the device to turn on. Similarly, when the light detector 208 indicates a second state of the interface 200, the processor 212 may cause the device to turn off.

In another example, also illustrated in FIG. 2, an interface 220 comprises a pivoting mirror 222, a shaft 226 and a button 228. The shaft 226 extends from and is engaged with the button 228. The pivoting mirror 222 pivots or rotates about the shaft 226 of the interface 220 when the button 228 is depressed and maintained in this depressed position. The interface 220 may also comprise a diaphragm 224 that environmentally seals the mirror 222 from the button 228. The mirror 222 may be biased to a position substantially orthogonal to the shaft 226 where light waves from a light source 206 may be reflected back toward a light detector 208 (as described above). Thus, as the button 228 is depressed and the shaft 226 extends away from the diaphragm 224, the mirror 222 pivots toward a reflecting position (not shown) whereby light is reflected toward the light detector 208. When the button 228 is depressed again (e.g., to release the button), the shaft 228 and mirror 222 rise toward the diaphragm 224. The diaphragm 224 may then provide a force to pivot the mirror 222 to a substantially parallel position with the shaft 228. In this substantially parallel position, no light waves are reflected back toward the light detector 208. In this way, the button 228 of the interface 220 and detection of reflected light by the light detector 208 may operate a device in a manner substantially similar to that described above with respect to interface 200.

It should be noted that the above two examples are not intended to be limiting. Rather, any mechanical mechanism for shielding and exposing a stationary mirror, and/or pivoting or rotating a mirror so as to cause an emitted light wave to be reflected toward a light detector to indicate a state of an interface, is intended to be within the scope of the present disclosure.

Another interface 240, as illustrated in FIG. 2, is a light that may serve as an indicator or visual signal regarding the state of a controlled device(s) or other interface. The interface 240 may comprise a light pipe or light mixing chamber 242. A light wave or light waves emitted from one or a plurality of light sources 206 (e.g., LEDs of varying colors) may be directed into the light pipe 242. If light waves of various wavelengths enter the light pipe 240, they may be mixed to form a new color. The light in the light pipe 242 may then be visible through an opening or diffused or clear cover 244 of the interface 240. In this way, the light source(s) 206 may be electrically connected to the processor 212 of the circuit board 210 and may be operated according to logic indicating a current state of a device or other interface.

FIG. 3 illustrates a plurality of example interfaces (300, 320, 340) that use inductive power and wireless communication. The wireless communication can be, for example, short-range communication such as Bluetooth®. According to a first example, an interface 300 comprises a button 302 connected to a shield 304, a light source 306 (e.g., an LED), a light detector 308, an inductive coil 310, and a Bluetooth® transceiver 312. The light source 306 and light detector 308 are arranged across from each other in the interface 300. Similar to the examples described above with respect to FIG. 2, as the button 302 is depressed, the shield 304 passes between the light source 306 and light detector 308 so as to disrupt communication of a light wave from the light source 306 to the light detector 308. When the button 302 is pressed again, the shield 304 may rise above the light source 306 and light detector 308 so as to allow the communication of light between the light source 306 and the light detector 308. In this way, the detection of light, or lack of detection of light (e.g., in the absence of light detection), by the light detector 308 can indicate a state of the button 302 and consequently, a state of the interface 300. The light detector 308 can be electrically connected to the inductive coil 310 and/or Bluetooth® transceiver 312, such that the inductive coil 310 and/or Bluetooth® transceiver 312 can be operated according to a state of the interface 300.

As with the first example of FIG. 3, a second example interface 320 of FIG. 3 comprises a button 322 connected to a post 324, a mechanical switch 326, an inductive coil 328, and a Bluetooth® transceiver 330. Rather than using an optical switch to control operation of the inductive coil 328 and/or Bluetooth® transceiver 330 as described above, the second example uses a mechanical switch 326. More specifically, as the button 322 is depressed, a beveled edge of the post 324 slides across the mechanical switch 326, thereby depressing the switch 326. However, in other embodiments, it is envisioned that the post 324 may be conductive so as to close a path between contacts as the button 324 is depressed. In still other embodiments, the post 324 may act as a first contact and, upon depression of the button 324, make contact with a second contact to close the switch. In any case, the state of the switch 326 is indicative of the state of the button 322, and the state of the button 322 is indicative of the state of the interface 320. Thus, the switch 326 is electrically connected to the inductive coil 328 and/or Bluetooth® transceiver 330 so as to control the operation of the inductive coil 328 and/or Bluetooth® transceiver 330 based on the state of the interface 320.

A corresponding inductive coil(s) 332 and/or Bluetooth® transceiver(s) 334 are mounted to the circuit board 210 and are electrically connected to the processor(s) 212. The inductive coil 332 and/or Bluetooth® transceiver 334 of the circuit board 210 can then communicate with the inductive coil(s) 310, 328 and/or Bluetooth® transceiver(s) 312, 330 of the interfaces 300, 320 based on the state of the interfaces 300, 320. In this way, the interfaces 300, 320 may operate and control the devices of the controller, as well as receive information from or about the devices of the controller, without being physically connected to the devices, circuit board 210, or interior of the enclosure 102. As with the examples described in FIGS. 2 and 3, the interfaces 200, 220, 240, 300, 320 are situated separate and apart from the interior of the enclosure 102, and the circuit board 210 is isolated within the interior of the enclosure 102, thereby increasing safety.

A third example of an interface 340 illustrated in FIG. 3 is an indicator light. The indicator light comprises an inductive coil 342, a Bluetooth® transceiver 344, a control 346, a light source (e.g., LED) 348, and a light pipe or light mixing chamber 350. The control 346 is electrically connected to the inductive coil 342, Bluetooth® transceiver 344, and light source 348. The indicator light interface 340 operates in a similar, but reversed, manner to the previous two examples of FIG. 3. That is, the inductive coil 342 and/or Bluetooth® transceiver 344 receive signals from an inductive coil 332 and/or Bluetooth® transceiver 334 on the circuit board 210. Based on the signals received therefrom, the control 346 operates the light source 348 so as to emit a light corresponding to or determined by the received signal. The light may be viewed through an opening or transparent/clear cover 352 of the interface 340. For example, a signal indicating a device status (e.g., power on or error) may be sent to the inductive coil 342 and/or Bluetooth® transceiver 344 of the interface 340. The control 346 may interpret this error signal and cause the light source 348 to output a colored light corresponding to the determined state or status of a device. In other embodiments, actuation of an interface may cause a change detectable by the control 346. For example, actuation of an interface could move an inductor thereby changing the efficiency of the system indicating a change to a device status or state. Such a change could be interpreted by software of the control 346, or otherwise detected by a hardware sensor element that provides an input to the control 346. For example, the detection could be the result of comparison to a threshold value. Thus, the actuation results in a change in the operation of the light source 348 by the control 346 according to a state or status of a device. In response to the input, the control 346 may also actuate a device (e.g., a relay or contact). In this way, the control 346 can operate to cause a status or state change and/or then indicate the result of the change.

Still another example of an interface 400 is illustrated in FIG. 4. In the example of FIG. 4, a pattern 402 is disposed on an underside of a button 404 (or post of a button) of the interface 400. A camera 406 mounted to the circuit board 210 and electrically connected to the processor(s) 212 is directed to capture images of the pattern 402. As the button 404 is depressed, the pattern 402 (and/or post on which the pattern is disposed) may be rotated or otherwise altered. By processing the captured images to determine the pattern 402 or orientation of the pattern 402, the processor 212 can determine the state of the interface 400. As with the other interfaces already described, the recognition of the state of the interface can be used to control a corresponding device.

While the above interfaces have been described as examples, it is noted that these are not intended to be a limiting or inclusive list of such interfaces. For example, a light source and light detector as discussed with respect to FIGS. 2 and 3 may be used as a smoke detector. That is, a light source may emit a light wave directly toward a light detector or toward a mirror such that the reflection directs the light wave toward a light detector, where failure of the light wave to reach the light detector would indicate the presence of interference such as smoke. Thus, if the light detector fails to detect a light wave or if the detected light has an intensity level below a predetermined threshold value, an alarm or other warning may be sounded indicating the presence of smoke in the enclosure of the housing. In still other variations of the above examples, infrared (IR) emission and/or radio frequency identification (RFID) may be used instead of, or in addition to, the optical mechanisms, inductor coils, and Bluetooth® transceivers.

Still other interfaces may use piezo-electric and/or magnetic actuation. For example, in a piezoelectric interface, a push button could be used to compress a piezoelectric element, thereby generating an electric current. This current could be used to activate a light source, inductive coil, Bluetooth® transceiver, or the like. Regarding magnetic actuation, a magnetic interface could take advantage of opposing magnets to actuate electrical contacts, without being in physical contact with the electrical contacts. Such a mechanism is described, for example, in U.S. application Ser. No. 14/026,583, which is herein incorporated by reference. Still other embodiments could utilize sensors to detect actuation of a magnetic interface by detecting a magnetic flux caused by the actuation.

The above described interfaces, and other interfaces envisioned within the scope of the present disclosure, may be automatically recognized by the controller. For example, each interface may have a unique identifying signal output that may be recognized by the processor in the controller. Such signals may be generated according to a reflected light wave pattern, IR pattern, inductive coil transmission, Bluetooth® transmission, RFID, or the like. In this way, the controllers could be further easily assembled by using a standard processor and interior electronics that do not require reconfiguration or reprogramming based on the desired interface(s) used for each controller.

It is also noted that the interfaces may be potted with a thermos-setting plastic, silicone, or the like so as to resist vibrations, prevent shocks, and further help isolate the interface from the interior of the enclosure.

A "processor" as used herein refers to any, or part of any, electrical circuit comprised of any number of electrical components, including, for example, resistors, transistors, capacitors, inductors, and the like. The circuit may be of any form, including, for example, an integrated circuit, a set of integrated circuits, a microcontroller, a microprocessor, a collection of discrete electronic components on a printed circuit board (PCB) or the like. The processor may also stand alone or be part of a computer used for operations other than processing image data. It should be noted that the above description is non-limiting, and the examples are but only a few of many possible processors envisioned.

What is claimed is:

1. A control system, comprising:
    an enclosure comprising an opening on a front face and electronics for controlling a device; and
    at least one interface mounted to the front face of the enclosure, which at least partially covers the opening and which is physically isolated from the electronics, wherein:
        the at least one interface is configured to communicate with the electronics,
        the enclosure has a first inductive coil and/or a first short-range wireless device, the first short-range wireless device being a receiver, transmitter, and/or transceiver,
        the at least one interface has a second inductive coil and/or a second short-range wireless device, the second short-range wireless device being a receiver, transmitter, and/or transceiver, and
        the at least one interface is wirelessly connected to the electronics via the first inductive coil and/or the first short-range wireless device.

2. The control system of claim 1, wherein the enclosure has at least one of an inlet and an outlet through which electronics or wiring of the device controlled by the control system pass.

3. The control system of claim 1, wherein the first inductive coil and second inductive coil are short-range wireless devices for transferring power and data.

4. The control system of claim 1, wherein the at least one interface has a light source, light detector, and a moveable shield, the moveable shield being moveable into and out of a space between light source and the light detector in response to a mechanical actuation of the interface by a user to interrupt or allow transmission of light from the light source to the light detector.

5. The control system of claim 4, wherein communication between the first inductive coil and/or first short-range wireless device, and the second inductive coil and/or second short-range wireless device is based on whether light from the light source is detected by the light detector.

6. The control system of claim 5, wherein the electronics control a device based on the communication.

7. The control system of claim 1, wherein the at least one interface has a mechanical or electrical switch that is actuated between a first state and a second state in response to a mechanical actuation of the interface by a user.

8. The control system of claim 7, wherein communication between the first inductive coil and/or first short-range wireless device, and the second inductive coil and/or second short-range wireless device is based on the state of the switch.

9. The control system of claim 8, wherein the electronics control a device based on the communication.

10. The control system of claim 1, wherein the at least one interface has a light source, a light mixing chamber, and a clear cover for viewing light from the light source, the light source being operated in response to communication between the first inductive coil and/or first short-range wireless device, and the second inductive coil and/or second short-range wireless device.

* * * * *